United States Patent
Komorita et al.

(10) Patent No.: US 9,356,101 B2
(45) Date of Patent: May 31, 2016

(54) POLYCRYSTALLINE ALUMINUM NITRIDE BASE MATERIAL FOR CRYSTAL GROWTH OF GAN-BASE SEMICONDUCTOR AND METHOD FOR MANUFACTURING GAN-BASE SEMICONDUCTOR USING THE SAME

(75) Inventors: Hiroshi Komorita, Yokohama (JP);
Noritaka Nakayama, Yokohama (JP);
Kentaro Takanami, Yokohama (JP)

(73) Assignees: KABUSHIKI KAISHA TOSHIBA, Tokyo (JP); TOSHIBA MATERIALS CO., LTD., Kanagawa-ken (JP)

( * ) Notice: Subject to any disclaimer, the term of this patent is extended or adjusted under 35 U.S.C. 154(b) by 0 days.

(21) Appl. No.: 13/806,337

(22) PCT Filed: Sep. 26, 2011

(86) PCT No.: PCT/JP2011/071884
§ 371 (c)(1),
(2), (4) Date: Feb. 26, 2013

(87) PCT Pub. No.: WO2012/043474
PCT Pub. Date: Apr. 5, 2012

(65) Prior Publication Data
US 2013/0168692 A1     Jul. 4, 2013

(30) Foreign Application Priority Data
Sep. 27, 2010   (JP) ................................. 2010-215697

(51) Int. Cl.
H01L 21/00      (2006.01)
H01L 29/20      (2006.01)
(Continued)

(52) U.S. Cl.
CPC .......... H01L 29/2003 (2013.01); C04B 35/581 (2013.01); C04B 41/009 (2013.01);
(Continued)

(58) Field of Classification Search
CPC .................. H01L 21/02107; H01L 21/02389; H01L 21/02428; H01L 21/0254; H01L 29/2003; C23C 16/303
USPC ............. 257/76, 613, E29.089; 438/478, 488
See application file for complete search history.

(56) References Cited

U.S. PATENT DOCUMENTS 8,664,687 B2 *   3/2014   Cho .................. H01L 21/02389
                                                                 257/103
2002/0102441 A1 *   8/2002   Shinosawa ............ C04B 35/581
                                                                 428/698

(Continued)

FOREIGN PATENT DOCUMENTS

JP      2003-018676          3/2003
JP      2004-111766 A1       8/2004

(Continued)

OTHER PUBLICATIONS

International Search Report dated Jan. 10, 2012, for PCT/JP2011/071884.

(Continued)

*Primary Examiner* — Whitney T Moore
*Assistant Examiner* — Joseph Galvin, III
(74) *Attorney, Agent, or Firm* — Harness, Dickey & Pierce, PLC

(57) ABSTRACT

There is provided a polycrystalline aluminum nitride substrate that is effective in growing a GaN crystal. The polycrystalline aluminum nitride base material for use as a substrate material for grain growth of GAN-base semiconductors, contains 1 to 10% by weight of a sintering aid component and has a thermal conductivity of not less than 150 W/m·K, the substrate having a surface free from recesses having a maximum diameter of more than 200 μm.

10 Claims, 1 Drawing Sheet

(51) Int. Cl.
   *C04B 35/581*   (2006.01)
   *C04B 41/00*   (2006.01)
   *C04B 41/50*   (2006.01)
   *C04B 41/87*   (2006.01)
   *C23C 16/30*   (2006.01)
   *C04B 111/00*   (2006.01)
   *H01L 21/02*   (2006.01)

(52) U.S. Cl.
   CPC ............. *C04B41/5062* (2013.01); *C04B 41/87* (2013.01); *C23C 16/303* (2013.01); *H01L 21/02107* (2013.01); C04B 2111/0025 (2013.01); C04B 2111/00844 (2013.01); C04B 2235/3208 (2013.01); C04B 2235/3224 (2013.01); C04B 2235/3225 (2013.01); C04B 2235/3227 (2013.01); C04B 2235/3229 (2013.01); C04B 2235/3865 (2013.01); C04B 2235/3895 (2013.01); C04B 2235/5436 (2013.01); C04B 2235/5445 (2013.01); C04B 2235/77 (2013.01); C04B 2235/786 (2013.01); C04B 2235/945 (2013.01); C04B 2235/963 (2013.01); C04B 2235/9607 (2013.01); C04B 2235/9638 (2013.01); H01L 21/0254 (2013.01); H01L 21/02389 (2013.01); H01L 21/02428 (2013.01)

(56) References Cited

U.S. PATENT DOCUMENTS

2006/0163605 A1   7/2006   Miyahara
2006/0183625 A1*  8/2006   Miyahara ............... C04B 35/053
                                                                501/98.4
2006/0255341 A1*  11/2006  Pinnington ............ B82Y 20/00
                                                                257/79

FOREIGN PATENT DOCUMENTS

JP   2010-076948       4/2010
KR   20060024421       3/2006
KR   20060031629       4/2006
WO   2004/005216 A1    1/2004

OTHER PUBLICATIONS

Korean Office Action dated Jan. 28, 2014 (with English translation) in related Korean Patent Application No. 10-2013-7001920.

Notice of Allowance of Patent dated Nov. 7, 2014 in corresponding Korean Patent Application No. 10-2013-7001920 (with English translation).

Office Action mailed Nov. 24, 2014 in related Chinese Patent Application No. 201180035289.5 (with English translation).

Japanese Office Action issued on Jun. 30, 2015 in corresponding Japanese Patent Application No. 2012-536435, with English translation.

Chinese Office Action issued on Oct. 9, 2015 in corresponding Chinese Patent Application No. 201180035289.5, with English translation.

Japanese Office Action issued on Feb. 2, 2016 in corresponding Japanese Patent Application No. 2012-536435, with English translation.

* cited by examiner

POLYCRYSTALLINE ALUMINUM NITRIDE BASE MATERIAL FOR CRYSTAL GROWTH OF GAN-BASE SEMICONDUCTOR AND METHOD FOR MANUFACTURING GAN-BASE SEMICONDUCTOR USING THE SAME

TECHNICAL FIELD

The present invention relates to a polycrystalline aluminum nitride base material for the crystal growth of a GaN-base semiconductor and a method for manufacturing a GaN-base semiconductor using the same.

BACKGROUND ART

The development of new light sources, for example, LEDs (light emitting diodes), photosemiconductor devices such as semiconductor lasers, and power devices using wide band gap semiconductors has been promoted from the viewpoints of environmental problems and energy saving.

Regarding semiconductors for use in these devices, gallium nitride (GaN) base semiconductors such as GaN, InGaN, AlGaN, and InAlGaN have drawn attention and have been used as layers constituting the devices. For example, LED elements have a structure including a stack of a plurality of thin GaN-base layers. For example, Japanese Patent Laid-Open No 111766/2004 (patent document 1) uses a multilayer structure of a GaN layer and a GaAlN layer. The yield of semiconductor is governed by the efficiency of the formation of and the evenness of thickness of the thin semiconductor layers.

Epitaxial growth is generally used for the manufacture of gallium nitride (GaN) base semiconductor devices. Up to now, sapphire or SiC substrates have been used as epitaxial substrates. These substrates, however, suffer from problems such as high cost (sapphire and SiC). Among others, since the sapphire and SiC substrates are single crystals, difficulties are encountered in increasing the substrate size. Further, in recent years, the growth of the GaN layer using sapphire substrates having a larger size has been desired from the viewpoint of increasing the number of acceptable semiconductor chips obtained per semiconductor substrate.

PRIOR ART DOCUMENT

Patent Document

Patent document 1: Japanese Patent Laid-Open No. 111766/2004

DISCLOSURE OF THE INVENTION

Problems to be Solved by the Invention

In growing a GaN (gallium nitride) base crystal on a substrate, irregularities on the surface of the substrate poses a problem. Specifically, when large surface irregularities are present, for example, a problem that the GaN crystal is not evenly grown, for example, separation of the crystal, occurs in growing the GaN-base crystal. Accordingly, an object of the present invention is to obtain a substrate that is used in the production of gallium nitride-base crystals and is inexpensive and, at the same time, has no significant surface irregularities.

Means for Solving the Problems

According to the present invention, there is provided a polycrystalline aluminum nitride base material for crystal growth of GaN-base semiconductors. Specifically, according to the present invention, there is provided a polycrystalline aluminum nitride base material for use as a substrate material for grain growth of GaN-base semiconductors, the polycrystalline aluminum nitride base material containing 1 to 10% by weight of a sintering aid component and having a thermal conductivity of not less than 150 W/m·K, and the substrate having a surface free from recesses having a maximum diameter of more than 200 µm.

In an embodiment of the present invention, preferably, the sintering aid component comprises one or more materials selected from the group consisting of rare earth elements, rare earth element oxides, and rare earth element-aluminum oxides.

In an embodiment of the present invention, preferably, the recesses are any one of pores, traces after dropping of AlN crystal grains, and traces after dropping of the sintering aid component.

In an embodiment of the present invention, preferably, the maximum diameter of the recesses is not more than 50 µm.

In an embodiment of the present invention, preferably, the polycrystalline aluminum nitride substrate has a surface roughness (Ra) of not more than 0.1 µm.

In an embodiment of the present invention, preferably, the polycrystalline aluminum nitride base material comprises an aluminum nitride crystal and a grain boundary phase, grains of the aluminum nitride crystal having a mean diameter of not more than 7 µm.

In an embodiment of the present invention, preferably, the substrate has a diameter of not less than 50 mm.

In an embodiment of the present invention, preferably, the substrate surface has 0 (zero) or one recess having a maximum diameter of more than 20 µm per unit area of 1 inch×1 inch.

In an embodiment of the present invention, preferably, 0 (zero) or one micropore having a maximum diameter of more than 0.5 µm is present per unit area of 1 inch×1 inch in the grain boundary phase on the surface of the substrate.

According to another aspect of the present invention, there is provided a method for manufacturing a GaN-base semiconductor, the method comprising growing a GaN-base semiconductor crystal using the above polycrystalline aluminum nitride base material.

In an embodiment of the present invention, preferably, the GaN-base semiconductor crystal is grown through a buffer layer.

In an embodiment of the present invention, preferably, the GaN-base semiconductor is one semiconductor selected from the group consisting of GaN, InGaN, AlGaN, and InAlGaN.

Effect of the Invention

The present invention can provide a polycrystalline aluminum nitride substrate having no significant surface irregularities. The use of the polycrystalline aluminum nitride substrate according to the present invention for the manufacture of GaN-base semiconductors can realize the manufacture of GaN-base semiconductors at a good yield.

BRIEF DESCRIPTION OF THE INVENTION

MODE FOR CARRYING OUT THE INVENTION

Figure 1:
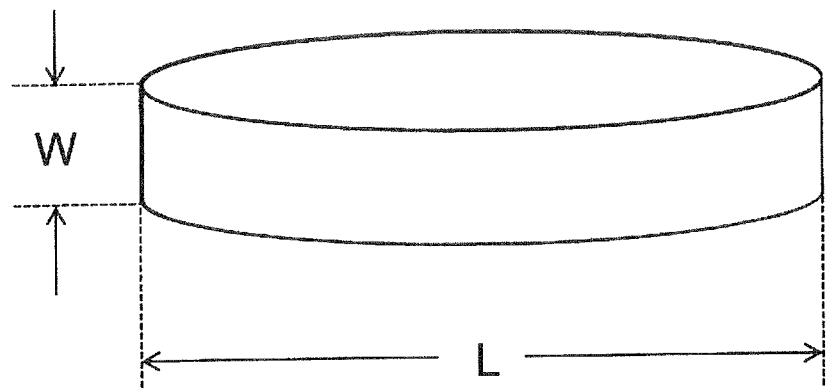
FIG. 1 is a diagram showing one embodiment of a polycrystalline aluminum nitride base material for crystal growth of GaN-base semiconductors according to the present invention.

The polycrystalline aluminum nitride substrate according to the present invention is a polycrystalline aluminum nitride base material for use as a substrate material for crystal growth of GaN-base semiconductors, characterized in that the polycrystalline aluminum nitride base material contains 1 to 10% by weight of a sintering aid component and has a thermal conductivity of not less than 150 W/m·K, and the substrate has a surface free from recesses having a maximum diameter of more than 200 μm.

The polycrystalline aluminum nitride substrate according to the present invention contains 1 to 10% by weight of the sintering aid component. The sintering aid is preferably an oxide of a rare earth element. The polycrystalline aluminum nitride substrate can be obtained by mixing the sintering aid powder and the aluminum nitride powder together and sintering the mixture.

The added sintering aid is converted to the sintering aid component after the sintering. Preferably, the sintering aid component includes one or more materials selected from the group consisting of rare earth elements, rare earth element oxides, and rare earth element-aluminum oxides. For example, when yttria ($Y_2O_3$) is used as the sintering aid, the sintering aid component is one or more of Y alone, $Y_2O_3$, and Y—Al—O compounds. Examples of Y—Al—O compounds include YAG, YAM, and YAL. Any of them can be identified by XRD (X-ray diffractometry).

When the content of the sintering aid component in the polycrystalline aluminum nitride substrate is less than 1% by weight, the densification is unsatisfactory and, consequently, a highly porous sintered compact (a polycrystalline aluminum nitride substrate) is formed. On the other hand, when the content of the sintering aid component is more than 10% by weight, the thermal conductivity is lowered due to the excessively high sintering aid component content. The content of the sintering aid component is preferably 2 to 6% by weight.

The polycrystalline aluminum nitride substrate has a thermal conductivity of not less than 150 W/m·K. When the polycrystalline aluminum nitride substrate has a high thermal conductivity of not less than 150 W/m·K, heat radiation in the crystal growth of the GaN-base semiconductor is so good that uniform crystal growth can be realized.

Further, the polycrystalline aluminum nitride substrate according to the present invention is characterized in that the substrate surface is free from recesses having a maximum diameter of more than 200 μm. The recess of the substrate surface is any one of pores, traces after dropping of AlN crystal grains, and traces after dropping of the sintering aid component. The pore is a minute opening, and the pores of a substrate densified to a relative density of not less than 99.0% and even not less than 99.5% are small. Filling the grain boundary among the AlN crystal grains with the sintering aid component using the sintering aid is effective in increasing the density.

The relative density is expressed in terms of a value obtained by dividing a value measured by an Archimedes method by a theoretical density determined by calculation (=(measured value/theoretical density)×100%). The theoretical density may be determined as follows. For example, when 3% by weight of $Y_2O_3$ is used as the sintering aid, since the theoretical density of AlN and the theoretical density of $Y_2O_3$ are 3.3 g/cm$^3$ and 5.03 g/cm$^3$, respectively, the theoretical density of the substrate is 3.3×0.97+5.03×0.03=3.3519 g/cm$^3$. The added sintering aid is converted to the sintering aid component after the sintering. In determining the theoretical density, as described above, this is dealt with the conversion of the rare earth element to an oxide.

The recesses on the substrate surface are formed by dropping of AlN crystal grains and dropping of particles of the sintering aid component. An example of preventing dropping of the AlN crystal grains is strengthening of the grain boundary with the sintering aid component. To this end, as described above, the content of the sintering aid component is preferably 1 to 10% by weight. On the other hand, a sintering aid component content above the upper limit of the above-defined range is disadvantageous in that particles of the sintering aid component are likely to be dropped when the substrate surface is polished.

The polycrystalline aluminum nitride substrate has a surface roughness (Ra) of not more than 0.1 μm, preferably not more than 0.05 μm. Preferably, the substrate surface has a skewness (Rsk) of +0.5 to −0.5, that is, is flat. When the substrate surface is flat and is free from large recesses, the yield of crystal growth of the GaN-base semiconductor is increased. The maximum diameter of recesses on the substrate surface is preferably not more than 50 μm from the viewpoint of further improving the yield. Most preferably, the substrate surface is free from recesses. However, in polycrystalline aluminum nitride substrates that are a sintered compact, the manufacture of a substrate having a recess-free surface is difficult. Accordingly, what is important is how to manufacture a substrate having no significant recesses. For this reason, in the present invention, preferably, the substrate surface is free from recess or has only one recess having a maximum diameter of more than 20 μm per unit area of 1 inch×1 inch. When the number of recesses having a maximum diameter of more than 20 μm is 0 or 1 per unit area of 1 inch×1 inch, in the step of growing the GaN-base semiconductor crystal, layer separation can be prevented and, at the same time, the effect of preventing the warpage of the GaN-base semiconductor can be attained. The number of recesses having a maximum diameter of more than 20 μm per unit area can be measured by magnifying and observing the substrate surface under a metallographic microscope. The observation of unit area of 1 inch×1 inch of the substrate surface under metallographic microscope can be carried out for three places to confirm that the substrate surface is free from recesses having a size of more than 200 μm and is free from recess or has only one recess having a size of more than 20 μm.

In the present invention, preferably, 0 (zero) or one micropore having a maximum diameter of more than 0.5 μm is present per unit area of 10 μm×10 μm in the grain boundary phase on the surface of the substrate. When the formation of micropores is suppressed, in the step of growing the GaN-base semiconductor crystal, layer separation can be prevented and, at the same time, the effect of preventing the warpage of the GaN-base semiconductor can be attained. Further, the formation of fine irregularities in the GaN-base semiconductor can be prevented, and the yield of the GaN-base semiconductor can be improved. The diameter and number of micropores can be measured by observation under SEM (scanning electron microscope). When the visual field of the SEM photograph is smaller than 10 μm×10 μm, the measurement is repeated a plurality of times until the total area reaches 10 μm×10 μm. This procedure is carried out for any three places (three places: each 10 μm×10 μm) to determine the number of micropores per unit area.

The polycrystalline aluminum nitride substrate includes an aluminum nitride crystal and a grain boundary phase. The mean diameter of grains of the aluminum nitride crystal is preferably not more than 7 μm. Recesses on the surface of the polycrystalline aluminum nitride substrate are formed by pores, traces after dropping of AlN crystal grains, and traces after dropping of sintering aid component particles. In order to reduce these factors, when the mean diameter of aluminum nitride crystal grains is small and not more than 7 μm, a triple point among aluminum nitride crystal grains is smaller, making it easy to fill the sintering aid component into the grain boundary. Filling of the sintering aid component into the small grain boundary is advantageous in that, even when dropping of particles of the sintering aid component that is causative of recesses occurs, the size of recesses is less likely to be more than 200 μm. Likewise, when the mean diameter of the aluminum nitride crystal grains is not more than 7 μm, the size of recesses formed by dropping of aluminum nitride crystal grains is also less likely to be more than 200 μm. As a result, even when planishing to a surface roughness (Ra) of not more than 0.1 μm, even not more than 0.05 μm, is carried out, a substrate can be provided in which the maximum diameter of recesses is not more than 200 μm (that is, recesses having a diameter of more than 200 μm are absent), even not more than 50 μm. The lower limit of the mean diameter of the aluminum nitride crystal grains is not particularly limited but is preferably 1 μm. When the mean grain diameter is less than 1 μm, a starting material powder having a small particle diameter should be used, leading to an increase in starting material cost.

The polycrystalline aluminum nitride substrate according to the present invention can also meet a large substrate having a diameter L of not less than 50 mm, even not less than 100 nm. In other words, even in substrates having a diameter L of not less than 50 mm, even not less than 100 mm, substrates free from recesses having a maximum diameter of more than 200 μm can be provided. In conventional sapphire and SiC substrates that are single-crystal substrates, difficulties are encountered in providing such large substrates and, further, the cost is likely to be significantly increased. The upper limit of the diameter L is not particularly limited but is preferably 300 mm from the viewpoint of easiness on the manufacture of the substrate. In FIG. 1, the substrate is shown as a disk. Alternatively, the crystal growth face may be square or rectangular.

The thickness W of the substrate is preferably 0.3 to 1.5 mm, more preferably 0.5 to 1.0 mm. When the thickness W is more than 1.5 mm, heat radiation is lowered. On the other hand, when the thickness W is smaller than 0.3 mm, the strength of the substrate is unsatisfactory, resulting in lowered handleability.

In the above polycrystalline aluminum nitride substrate, a problem of unevenness attributable to recesses during crystal growth can be suppressed, contributing to a significant improvement in yield. The polycrystalline aluminum nitride substrate is effective as a substrate material for grain growth of GaN-base semiconductors.

Figure 2:
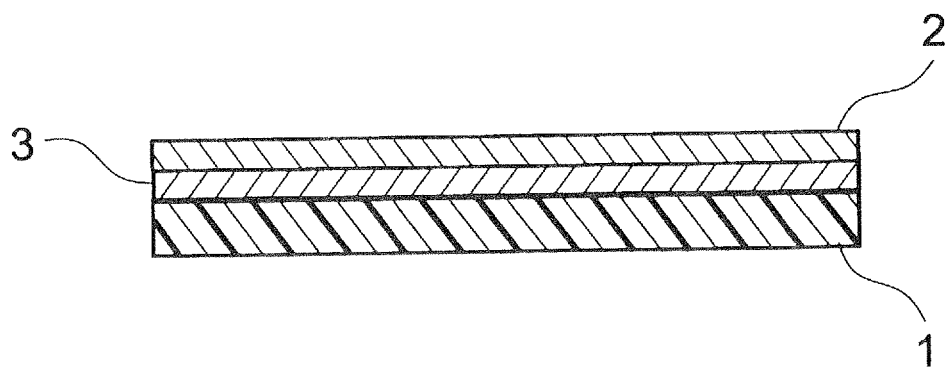
FIG. 2 is a schematic cross-sectional view showing one embodiment of a method for manufacturing a GaN-base semiconductor.

A method for manufacturing a GaN semiconductor using the polycrystalline aluminum nitride substrate will be described. FIG. 2 is a schematic cross-sectional view showing one embodiment of a manufacturing process of a GaN-base semiconductor. In the drawing, numeral 1 designates a polycrystalline aluminum nitride base material, numeral 2 a GaN-base semiconductor layer, and numeral 3 a buffer layer. At the outset, a buffer layer 3 is formed on the polycrystalline aluminum nitride substrate 1. The buffer layer 3 is preferably formed of the same material as the GaN-base semiconductor layer. A GaN-base semiconductor crystal is then grown on the buffer layer 3.

The GaN-base semiconductor is preferably one material selected from the group consisting of GaN, InGaN, AlGaN, and InAlGaN. All the materials are based on GaN. In the step of growing a GaN-base semiconductor crystal, the polycrystalline aluminum nitride substrate 1 is placed on a susceptor (not shown). A GaN buffer layer is formed by a metal-organics chemical vapor deposition method (MOCVD method) at 500° C. to 600° C. while allowing a TMG gas (trimethyl gallium gas) and an ammonium gas to flow. The thickness of the GAN layer is increased (by crystal growth) at 1000° C. to 1100° C. The MOCVD method is carried out at an elevated temperature of 500° C. to 1100° C., and, thus, when large recesses are present on the surface of the substrate, a variation in thickness of the GaN layer disadvantageously occurs. In particular, expansion or contraction of the substrate in the step of cooling from an elevated temperature of 1100° C. to 600° C. affects the warpage. When the substrate has large surface irregularities, for example, a problem of separation of GaN layer is disadvantageously likely to occur. In the polycrystalline aluminum nitride substrate according to the present invention, the maximum diameter of recesses is not more than 200 μm, that is, so small that problems such as layer separation can be significantly suppressed. Therefore, even when the polycrystalline aluminum nitride substrate has a large diameter of not less than 50 mm, the problem of layer separation can be suppressed. As a result, the GaN-base semiconductor can be grown in a large area, and, thus, a number of light emitting elements can be obtained per substrate, contributing to improved weight productivity. It is needless to say that, in manufacturing light emitting elements such as LEDs and semiconductor lasers, for example, the formation of various layers such as a GaN-base semiconductor layer and an insulating layer and etching are carried out. In the manufacture of light emitting elements, the polycrystalline aluminum nitride substrate may be removed if unnecessary. When the polycrystalline aluminum nitride substrate includes a grain boundary phase, the polycrystalline aluminum nitride substrate can easily be removed with an alkaline solution or the like, or alternatively can be scraped off.

The method for manufacturing a polycrystalline aluminum nitride substrate according to the present invention will be described. The polycrystalline aluminum nitride substrate according to the present invention may be manufactured by any method without particular limitation. An example of a method that can manufacture the polycrystalline aluminum nitride substrate at a high yield will be described.

At the outset, an aluminum nitride powder is provided as the starting material powder. Preferably, the aluminum nitride powder has a mean particle diameter of 0.6 μm to 2 μm. When the mean particle diameter is less than 0.6 μm, the particle diameter is so small that there is a possibility that the cost of the aluminum nitride powder is increased. On the other hand, when the mean particle diameter is more than 2 μm, there is a high possibility that the mean grain diameter of the aluminum nitride crystal after sintering exceeds 7 μm. More preferably, an aluminum nitride powder having a mean particle diameter of 1.0 μm to 1.5 μm is used. Preferably, the content of oxygen in the aluminum nitride powder is 0.6 to 2% by weight. Preferably, the aluminum nitride powder has an impurity oxygen content of 0.5 to 2% by weight. When the aluminum nitride powder is highly pure and has an impurity oxygen content of less than 0.5% by weight, the cost is increased. On the other hand, when the impurity oxygen content is more than 2% by weight, the thermal conductivity is likely to be less than 150 W/m·K.

An oxide of at least one element selected from the group consisting of Ca, Y, La, Ce, Nd, Pr, Eu, Gd, Dy, Ho, Er, Yb, and Lu is selected as the sintering aid, and 1 to 10% by weight of the oxide powder is mixed. The sintering aid is preferably an oxide of a rare earth element, more preferably yttria ($Y_2O_3$).

Preferably, the sintering aid powder has a mean particle diameter of 0.6 to 2 μm. When the mean particle diameter of the sintering aid powder is similar to that of the aluminum nitride powder, the starting material powder can easily be homogeneously mixed.

Next, the aluminum nitride powder, the sintering aid powder, a binder, a solvent, and optionally a dispersant and the like are mixed to prepare a starting material slurry.

Subsequently, a molded product is prepared using the starting material slurry thus prepared. Examples of molding methods include sheet forming using doctor blading and press molding in which granules prepared from the slurry is molded in a mold. Large molded products having a diameter of not less than 50 mm and even not less than 100 mm can be easily prepared by doctor blading. The molded product is in a sheet form, if necessary, the molded product may be fabricated into a disk form.

The step of sintering the molded product is carried out after degreasing the molded product. The sintering temperature is preferably 1600° C. to 1900° C. Preferably, the sintering is carried out in an inert atmosphere.

In the sintered compact thus obtained, the GaN-base semiconductor formed surface is planished. The surface is polished with a diamond wheel to a surface roughness Ra of not more than 0.1 μm, preferably not more than 0.05 μm. Further, if necessary, the sintered compact may be worked to adjust the shape of the side surface and back surface.

Two-stage polishing may be mentioned as a method for suppressing the occurrence of dropping of AlN crystal grains and sintering aid component particles. The two-stage polishing is a method in which, in planishing, semi-finishing is first carried out with a grinding wheel of #180 to #325 followed by polishing with a fine grinding wheel of not less than #325 (preferably #325 to #400). The size of recesses on the surface of the substrate can be brought to not more than 200 μm (that is, recesses having a size of more than 200 μm are absent) by the two-stage polishing. Further, the two-stage polishing can allow the skewness (Rsk) of the substrate surface to fall within a range of −0.5 to +0.5.

Methods that can provide a polycrystalline aluminum nitride substrate having a surface free from recesses having a maximum diameter of more than 200 μm include, but are not limited to, the following method. For example, the starting material slurry is passed through a mesh having an opening of 20 μm to 100 μm. Passing of the starting material slurry through the mesh a plurality of times is particularly effective. According to this method, aggregates in the starting material slurry that are causative of the formation of recesses having a size of more than 20 μm can be removed.

Another method is to deaerate the starting material slurry. Air bubbles contained in the starting material slurry can be removed by deaeration. The air bubbles contained in the starting material slurry are causative of recesses after sintering, and, thus, the deaeration of the starting material slurry is effective. The deaeration is preferably carried out under conditions of a degree of vacuum of 4 to 6 kPa and a deaeration time of 10 min to 2 hr.

A still another method is to adopt sintering under pressurized atmosphere. Sintering in a mold is likely to be influenced by the state of the surface of the mold. In the sintering under pressurized atmosphere, uniform pressure can be applied by the atmosphere, and, thus, a polycrystalline aluminum nitride substrate that is a sintered compact having a flat surface state can easily obtained. Preferably, the pressure of the atmosphere is maintained at 3 to 8 kPa.

A further method is to polish, by 20 μm or more, the surface of the polycrystalline aluminum nitride substrate in a thickness-wise direction by the step of polishing with a grinding wheel of not less than #325. In the polycrystalline aluminum nitride substrate, the sintering aid component is likely to ooze on the surface of the substrate in the sintering step. Polishing of the surface by 20 μm or more can allow the oozed sintering aid component to be removed. The polishing may be combined with the two-stage polishing step. Further, the above four methods may be used in combination.

In order that the number of micropores having a maximum diameter of more than 0.5 μm in the grain boundary phase is 0 to 1 per unit area of 10 μm×10 μm, the use of a combination of two or more of the four methods is effective. A combination of the passing through a mesh that is the first method with the sintering under pressurized atmosphere that is the third method is particularly preferred.

EXAMPLES

Examples 1 to 5 and Comparative Example 1

An aluminum nitride powder (mean particle diameter 1 μm, oxygen content 1.0% by weight) and a yttria ($Y_2O_3$) powder (mean particle diameter 1 μm) were mixed at a mixing ratio specified in Table 1 to prepare starting material powders.

In the mixing, the starting material powders were added to a solvent such as toluene or ethanol, and an organic binder and a plasticizer were further added thereto, followed by mixing to prepare starting material slurries. Green sheets having a thickness of 1.2 mm were formed by doctor blading using the starting material slurries thus obtained. The green sheets were cut into pieces having a size of 170 mm in length×170 mm in width that were then degreased, were sintered at 1700° C. to 1850° C. for 3 hr to 5 h in nitrogen to obtain polycrystalline aluminum nitride substrates. The polycrystalline aluminum nitride substrates thus obtained were planished under conditions specified in Table 1 to prepare polycrystalline aluminum nitride substrates of Example 1 to 5 and Comparative Example 1.

TABLE 1

| | Addition amount of sintering aid (% by weight) | Planishing | | Surface roughness Ra of substrate (μm) |
| --- | --- | --- | --- | --- |
| | | Diamond wheel No. in first polishing | Diamond wheel No. in second polishing | |
| Example 1 | 1 | #200 | #400 | 0.1 |
| Example 2 | 2 | #180 | #325 | 0.05 |
| Example 3 | 3 | #200 | #500 | 0.02 |
| Example 4 | 3 | #300 | #500 | 0.01 |
| Example 5 | 5 | #200 | #400 | 0.01 |
| Comparative Example 1 | 3 | #400 | — | 0.1 |

The polycrystalline aluminum nitride substrates were subjected to measurement of thermal conductivity, maximum diameter of recesses on the surface of the substrate, skewness (Rsk) of the surface of the substrate, mean grain diameter of AlN crystal grains, sintering aid component, and relative density. The thermal conductivity was measured by a laser flash method. The maximum diameter of recesses on the surface of the substrate was determined by taking an enlarged photograph of unit area of 500 μm×500 μm of the surface of the substrate, and measuring the length of the longest diagonal of the recess on the photograph. This work was carried out for any five places on the surface of the substrate, and the largest value was regarded as "maximum diameter of recess." The skewness (Rsk) was determined with a surface roughness meter. Further, the mean grain diameter of the AlN crystal grains was measured by taking an enlarged photograph of any cross-sectional photograph 100 μm×100 μm, and measuring diameters by a line intercept method. Further, the sintering aid component was analyzed by XRD (X-ray diffractometry). The relative density was determined by (measured value obtained by an Archimedes method/theoretical value determined by calculation from composition)×100(%). The results are shown in Table 2.

TABLE 2

|  | Relative density | Skewness Rsk of substrate surface | Thermal conductivity, (W/m · k) | Mean diameter of AlN crystal grains (μm) | Maximum diameter of recess on surface of substrate (μm) |
| --- | --- | --- | --- | --- | --- |
| Example 1 | 99.9 | −0.5 | 190 | 10 | 168 |
| Example 2 | 99.9 | −0.4 | 180 | 7 | 86 |
| Example 3 | 99.9 | −0.3 | 170 | 5 | 46 |
| Example 4 | 99.9 | −0.2 | 170 | 4 | 39 |
| Example 5 | 99.9 | +0.1 | 150 | 4 | 36 |
| Comparative Example 1 | 99.9 | −1.0 | 170 | 5 | 24.5 |

As can be seen from Table 1, for Examples 1 to 5 where two-stage polishing was carried out, the surface of the substrate could be brought to such a state that the maximum diameter of the recesses on the surface of the substrate was not more than 200 μm (that is, none of the recesses exceeded 200 μm). On the other hand, for Comparative Example 1 where two-stage polishing was not carried out, large recesses existed as traces after dropping of the AlN crystal grains or dropping of the sintering aid component.

As a result of an XRD analysis of the polycrystalline aluminum nitride substrates of Examples 1 to 5 and Comparative Example 1, a composite oxide of a YAG phase ($Y_3Al_5O_{12}$) or a YAP phase ($YAlO_3$) was detected as the sintering aid component.

Examples 1A to 5A and Comparative Example 1A

The polycrystalline aluminum nitride substrates of Examples 1 to 5 and Comparative Example 1 were fabricated into a disk having a size of 2 inches (50.8 mm) in diameter×1 mm in thickness and a surface roughness (Ra) of 0.01 μm. Crystals of GaN semiconductors were grown using the samples.

The sample (polycrystalline aluminum nitride substrate) was placed on a susceptor within a MOCVD device. A GaN buffer layer was formed by a metal-organics chemical vapor deposition method (MOCVD method) at 500° C. to 600° C. while allowing a TMG gas (trimethyl gallium gas) and an ammonium gas to flow. The thickness of the GAN layer was increased (by crystal growth) at 1000° C. to 1100° C. The thickness of the buffer layer was 0.02 μm, and the final thickness of the GaN layer was 3 μm. The GaN layer was provided on the surface of the polycrystalline aluminum nitride substrate (diameter 2 inches).

The presence or absence of layer separation was determined for the GaN-base semiconductors thus obtained. Samples free from the separation defect (that are usable in the next step) were indicated by "○"; samples that suffered from some separation defect were indicated by Δ, and samples that suffered from the separation defect (that are unusable in the next step) were indicated by "x." The results are shown in Table 3.

TABLE 3

|  | Polycrystalline aluminum nitride substrate | Layer separation |
| --- | --- | --- |
| Example 1A | Example 1 | Δ |
| Example 2A | Example 2 | Δ |
| Example 3A | Example 3 | ○ |
| Example 4A | Example 4 | ○ |
| Example 5A | Example 5 | ○ |
| Comparative Example 1A | Comparative Example 1 | X |

As is apparent from the table, in order to obtain GaN single crystals free from layer separation, in the polycrystalline aluminum nitride substrate, a maximum diameter of the surface recesses of not more than 200 μm, even not more than 50 μm, is important. Further, the polycrystalline aluminum nitride substrates of Examples 1 to 5 have a high thermal conductivity of not less than 150 W/m/K and thus have good heat radiation. It is considered that this good property is effective in suppressing layer separation defects. As a result, light emitting elements such as LEDs and semiconductor lasers can be efficiently manufactured.

Examples 6 to 10

An aluminum nitride powder (mean particle diameter 0.8 μm, oxygen content 1.0% by weight) (97% by weight) and 3% by weight of a yttria ($Y_2O_3$) powder (mean particle diameter 1.2 μm) were mixed together to prepare a starting material powder.

In the mixing, the starting material powder was added to a solvent such as toluene or ethanol, and an organic binder and a plasticizer were further added thereto, followed by mixing to prepare a starting material slurry. A green sheet having a thickness of 1.2 mm was formed by doctor blading using the starting material slurry thus obtained. The green sheet was cut into pieces having a size of 170 mm in length×170 mm in width that were then degreased, was sintered at 1700° C. to 1850° C. for 3 hr to 5 hr in a nitrogen atmosphere pressurized to 2 kPa to obtain a polycrystalline aluminum nitride substrate. The polycrystalline aluminum nitride substrate thus obtained was subjected to a first polishing step with a diamond wheel of #300 and a second polishing step with a diamond wheel of #500 to prepare a polycrystalline aluminum nitride substrate of Example 6. The second polishing step was carried by a thickness up to 10 μm. The surface roughness Ra of the substrate thus obtained was 0.01 μm.

A polycrystalline aluminum nitride substrate of Example 7 was prepared in the same manner as in Example 6, except that, in the manufacture of the polycrystalline aluminum nitride substrate, the starting material slurry was passed through a mesh having an opening of 60 μm and was then passed through a mesh having an opening of 30 μm.

A polycrystalline aluminum nitride substrate of Example 8 was prepared in the same manner as in Example 6, except that, in the manufacture of the polycrystalline aluminum nitride substrate, the pressure of the nitrogen gas atmosphere during the sintering step was brought to 6 kPa.

A polycrystalline aluminum nitride substrate of Example 9 was prepared in the same manner as in Example 7, except that, in the manufacture of the polycrystalline aluminum nitride substrate, the pressure of the nitrogen gas atmosphere during the sintering step was brought to 6 kPa. In the manufacture of the polycrystalline aluminum nitride substrate of Example 9, a combination of the step of passing the starting material slurry through the mesh with the step of sintering under pressurized atmosphere was adopted.

A polycrystalline aluminum nitride substrate of Example 10 was prepared in the same manner as in Example 6, except that, in the manufacture of the polycrystalline aluminum nitride substrate, the starting material slurry was vacuum-deaerated at 5 kPa for 20 min and the pressure of the nitrogen gas atmosphere was brought to 5 kPa.

For the polycrystalline aluminum nitride substrates of Examples 6 to 10 thus obtained, the relative density, the skewness Rsk of the substrate surface, the thermal conductivity, the mean crystal grain diameter of the AlN crystal grains, and the maximum diameter of the recesses of the substrate surface were determined. The results are shown in Table 4.

TABLE 4

| | Relative density | Skewness Rsk of substrate surface | Thermal conductivity (W/m·k) | Mean diameter of AlN crystal grains (μm) | Maximum diameter of recess on surface of substrate (μm) |
|---|---|---|---|---|---|
| Example 6 | 99.9 | −0.2 | 170 | 4 | 32 |
| Example 7 | 99.9 | −0.1 | 170 | 4 | 18 |
| Example 8 | 99.9 | −0.1 | 170 | 4 | 17 |
| Example 9 | 99.9 | −0.1 | 170 | 4 | 15 |
| Example 10 | 99.9 | −0.1 | 170 | 4 | 15 |

Next, the number of recesses having a size of more than 20 μm on the surface of the substrate and the number of micropores having a size of more than 0.5 μm in the grain boundary phase were determined. The number of recesses having a size of more than 20 μm was determined by observing a unit area of 1 inch×1 inch of the substrate surface under a metallographic microscope and counting the number of recesses having a size of more than 20 μm observed in the microscope. This procedure was carried out for any three places, and the number of recesses in the place where the number of recesses having a size of more than 20 μm is largest among the three places was regarded as the number of recesses having a size of more than 20 μm in the "unit area of 1 inch×1 inch."

The number of micropores having a size of more than 0.5 μm in the grain boundary phase was determined by observing the substrate surface under SEM (scanning electron microscope) and counting the number of micropores having a size of more than 0.5 μm present in the grain boundary phase. Specifically, a SEM photograph of an area of 10 μm×10 μm was taken, and the number of micropores having a maximum diameter of more than 0.5 μm in the photograph was counted. This procedure was carried out for any three places, and the number of micropores in the place where the number of micropores having a size of more than 0.5 μm is largest among the three places was regarded as the number of micropores having a size of more than 0.5 μm in the "unit area of 10 μm×10 μm." The results are shown in Table 5.

TABLE 5

| | Number of recesses having size of more than 20 μm (recesses/unit area of 1 inch × 1 inch) | Number of micropores having size of more than 0.5 μm (micropores/unit area of 10 μm × 10 μm) |
|---|---|---|
| Example 6 | 1 | 3 |
| Example 7 | 0 | 1 |
| Example 8 | 0 | 1 |
| Example 9 | 0 | 0 |
| Example 10 | 0 | 0 |

Unlike the polycrystalline aluminum nitride substrate of Example 6, the polycrystalline aluminum nitride substrates of Examples 7 to 10 had a maximum recess size of not more than 20 μM and was free from recesses having a size of more than 20 μm. Further, since a method for suppressing the formation of micropores having a size of more than 0.5 μm was adopted, the number of micropores having a size of more than 0.5 μm was 0 to 1 per the unit area of 10 μm×10 μm. In particular, for the polycrystalline aluminum nitride substrates of Examples 9 and 10 where a combination of two or more methods for suppressing the formation of micropores having a size of more than 0.5 μm was adopted, the number of micropores having a size of more than 0.5 μm could be reduced to 0.

Examples 6A to 10A

The polycrystalline aluminum nitride substrates of Examples 6 to 10 were fabricated into a disk having a size of 6 inches (152.4 mm) in diameter×1 mm in thickness and a surface roughness (Ra) of 0.01 μm. Crystals of GaN semiconductors were grown using the samples.

The sample (polycrystalline aluminum nitride substrate) was placed on a susceptor within a MOCVD device. A GaN buffer layer was formed by a metal-organics chemical vapor deposition method (MOCVD method) at 500° C. to 600° C. while allowing a TMG gas (trimethyl gallium gas) and an ammonium gas to flow. The thickness of the GaN layer was increased (by crystal growth) at 1000° C. to 1100° C. The thickness of the buffer layer was 0.02 μm, and the final thickness of the GaN layer was 3 μm. The GaN layer was provided on the surface of the polycrystalline aluminum nitride substrate (diameter 6 inches).

The presence or absence of layer separation was determined for the GaN-base semiconductors thus obtained in the same manner as in Example 1A. Further, the presence or absence of warpage was determined for the GaN-base semiconductors. Regarding the warpage level, the warpage level in a diameter of 6 inches was measured and was converted to a warpage per inch. Samples, of which the warpage level per inch was 20 μm (exclusive) to 30 μm (inclusive), were indicated by "Δ," samples, of which the warpage level per inch was 10 μm (exclusive) to 20 μm (inclusive), were indicated by "○," and samples, of which the warpage level per inch was 10 μm (inclusive) or less, were indicated by "⊙." The results are shown in Table 6. It is needless to say that a lower warpage level shows better results.

TABLE 6

| | Polycrystalline aluminum nitride substrate | Presence or absence of layer separation | Warpage level of GaN-base semiconductor |
|---|---|---|---|
| Example 6A | Example 6 | ○ | Δ |
| Examsle 7A | Example 7 | ○ | ○ |

TABLE 6-continued

| | Polycrystalline aluminum nitride substrate | Presence or absence of layer separation | Warpage level of GaN-base semiconductor |
|---|---|---|---|
| Example 8A | Example 8 | ◯ | ◯ |
| Example 9A | Example 9 | ◯ | ⊚ |
| Example 10A | Example 10 | ◯ | ⊚ |

As is apparent from Tables 5 and 6, reducing the number of recesses having a size of more than 20 μm and the number of micropores having a size of more than 0.5 μm in the grain boundary phase could prevent layer separation and could reduce the warpage level, demonstrating that the yield of the GaN-base semiconductor can be improved.

DESCRIPTION OF REFERENCE CHARACTERS

1 . . . polycrystalline aluminum nitride base material
2 . . . GaN-base semiconductor layer
3 . . . buffer layer
L . . . diameter of polycrystalline aluminum nitride base material
W . . . thickness of polycrystalline aluminum nitride base material

The invention claimed is:

1. A polycrystalline aluminum nitride base material for use as a substrate material for grain growth of GaN-base semiconductors, the polycrystalline aluminum nitride base material containing 1 to 10% by weight of a sintering aid component and having a thermal conductivity of not less than 150 W/m·K, and the substrate having a surface free from recesses having a maximum diameter of more than 200 μm,
wherein the sintering aid component comprises one or more materials selected from the group consisting of rare earth elements, rare earth element oxides, and rare earth element-aluminum oxides,
the recesses are any one of pores, traces after dropping of AlN crystal grains, and traces after dropping of the sintering aid component,
the polycrystalline aluminum nitride base material comprises an aluminum nitride crystal and a grain boundary phase, grains of the aluminum nitride crystal having a mean diameter of not less than 1 μm and not more than 7 μm, and
the substrate surface has a skewness ($R_{sk}$) of +0.5 to −0.5, and
the substrate has a diameter of not less than 50 mm.

2. The polycrystalline aluminum nitride substrate according to claim 1, wherein the maximum diameter of the recesses is not more than 50 μm.

3. The polycrystalline aluminum nitride base material according to claim 1, wherein the substrate has a diameter of not less than 50 mm.

4. The polycrystalline aluminum nitride base material according to claim 1, wherein the substrate surface has 0 (zero) or one recess having a maximum diameter of more than 20 μm per unit area of 1 inch×1 inch.

5. The polycrystalline aluminum nitride base material according to claim 1, wherein 0 (zero) or one micropore having a maximum diameter of more than 0.5 μm is present per unit area of 10 μm×10 μm in the grain boundary phase on the surface of the substrate.

6. A method for manufacturing a GaN-base semiconductor, the method comprising growing a GaN-base semiconductor crystal using a polycrystalline aluminum nitride base material according to claim 1.

7. The method for manufacturing a GaN-base semiconductor according to claim 6, wherein the GaN-base semiconductor crystal is grown through a buffer layer.

8. The method for manufacturing a GaN-base semiconductor according to claim 6, wherein the GaN-base semiconductor is one semiconductor selected from the group consisting of GaN, InGaN, AlGaN, and InAlGaN.

9. The polycrystalline aluminum nitride base material according to claim 1, wherein the crystal growth face of the polycrystalline aluminum nitride substrate is disk, square or rectangular.

10. The polycrystalline aluminum nitride base material according to claim 1, wherein the polycrystalline aluminum nitride substrate has a disk-shaped having a diameter of not less than 100 mm.

* * * * *